(12) United States Patent
Nall et al.

(10) Patent No.: US 9,277,685 B2
(45) Date of Patent: Mar. 1, 2016

(54) SYSTEMS AND METHODS FOR SIMULATING NEON LIGHTING USING LIGHT EMITTING DIODES

(71) Applicant: GE Lighting Solutions LLC, East Cleveland, OH (US)

(72) Inventors: Jeffrey Marc Nall, Brecksville, OH (US); Brian Morgan Spahnie, E. Cleveland, OH (US); Robert Brassell, E. Cleveland, OH (US); Yongli Feng, XiAn (CN)

(73) Assignee: GE LIGHTING SOLUTIONS, LLC, East Cleveland, OH (US)

( * ) Notice: Subject to any disclaimer, the term of this patent is extended or adjusted under 35 U.S.C. 154(b) by 0 days.

(21) Appl. No.: 14/134,775

(22) Filed: Dec. 19, 2013

(65) Prior Publication Data

US 2015/0176786 A1 Jun. 25, 2015

(51) Int. Cl.
| | |
|---|---|
| H05K 13/00 | (2006.01) |
| H05K 1/18 | (2006.01) |
| F21V 23/06 | (2006.01) |
| F21S 4/00 | (2006.01) |
| F21V 17/00 | (2006.01) |
| F21Y 103/00 | (2006.01) |
| F21V 21/002 | (2006.01) |
| F21V 23/00 | (2015.01) |
| F21Y 101/02 | (2006.01) |

(52) U.S. Cl.
CPC .............. *H05K 13/0023* (2013.01); *F21S 4/003* (2013.01); *F21V 17/002* (2013.01); *F21V 23/06* (2013.01); *H05K 1/189* (2013.01); *F21V 21/002* (2013.01); *F21V 23/005* (2013.01); *F21Y 2101/02* (2013.01); *F21Y 2103/003* (2013.01); *Y10T 29/4913* (2015.01)

(58) Field of Classification Search
CPC ...... F21S 4/007; F21S 4/003; H05K 13/0023; H05K 1/189; F21V 17/002; F21V 23/06
See application file for complete search history.

(56) References Cited

U.S. PATENT DOCUMENTS

| | | | |
|---|---|---|---|
| 6,371,637 B1 * | 4/2002 | Atchinson et al. | 362/555 |
| 7,210,818 B2 | 5/2007 | Luk et al. | |
| 7,507,001 B2 | 3/2009 | Kit | |
| 7,850,341 B2 | 12/2010 | Mrakovich et al. | |
| 8,049,112 B2 | 11/2011 | Yang | |
| 2002/0149933 A1 * | 10/2002 | Archer et al. | 362/234 |
| 2008/0067526 A1 * | 3/2008 | Chew | 257/88 |
| 2012/0043115 A1 | 2/2012 | Chen et al. | |

FOREIGN PATENT DOCUMENTS

WO   WO2007/000037 A1   1/2007

* cited by examiner

*Primary Examiner* — Mary Ellen Bowman
(74) *Attorney, Agent, or Firm* — GE Global Patent Operation; Peter T. DiMauro (57) ABSTRACT

A system for simulating neon light comprising an elongated guide containing outer surface and a channel; a housing containing an engagement member and area for receiving a light engine; and the light engine. The light engine comprising a flexible printed circuit (FPC), a plurality of light emitting diodes (LEDs) attached to the FPC, and a plurality of electrical connectors all in contact with a power conductor. The FPC also includes a gathering of material between each of the plurality of electrical connectors. Also included is a method for reducing the stress within the light engine.

20 Claims, 6 Drawing Sheets

SYSTEMS AND METHODS FOR SIMULATING NEON LIGHTING USING LIGHT EMITTING DIODES

I. FIELD OF INVENTION

The present invention relates generally to simulating neon lighting. More specifically, the present invention relates to the light engine of a fixture that simulates neon lighting.

II. BACKGROUND OF THE INVENTION

LED light assemblies have been used to simulate neon light due to fragileness of typical neon lighting fixtures. These LED light assemblies include an extruded plastic tube, made of varying shapes and sizes, and a light engine containing LEDs, a printed circuit board (PCB), an electrical connector, and a power conductor, among others. The light engine is created by mounting the LEDs onto the PCB, attaching the PCB/LED assembly onto the electrical connector, and attaching the electrical connector to the power conductor. The light engine is then inserted into the plastic tube to create the overall LED light assembly.

One issue when using LED light assemblies to simulate neon light is that replacing failed LEDs can be cumbersome due to interconnecting of the electrical connectors within the light assembly. Since LED light assemblies simulate neon lighting via a light engine, failure of one connector within the light engine may cause failure of the entire light engine.

Another issue with using LED light assemblies to simulate neon light is rigidness of the overall assembly. Although the extruded plastic tube can be produced in varying shapes and sizes, the ability of a consumer to alter the shape of the light assembly after the tube is manufactured is minimal. The rigidness of the light assembly is primarily due to the inflexibility of the PCB. Therefore, when the consumer desires a new LED light assembly shape, the consumer must replace the initial plastic tube with a new plastic tube of the desired shape. Additionally, the replacement of the initial plastic tube normally requires replacing the light engine with a new light engine to fit the new plastic tube of the desired shape.

Attempts to have been made to streamline issues associated with LED light assemblies. One attempt to correct the issue of light engine failure has been the creation of a light engine containing a series of independent electrical connectors, e.g., insulation displacement connectors (IDCs). Although IDCs can prevent cascading electrical connector failures, their use can be costly. Additionally, using IDCs does not address the consumer's inability to change the shape of the LED light assembly.

III. SUMMARY OF EMBODIMENTS OF THE INVENTION

Given the aforementioned deficiencies, a need exists for systems and methods to simulate neon light that prevent complete failure of a light engine without exclusive use of IDCs. Additionally, the need exists for a flexible light engine that can facilitate LED light assembly shaping by the consumer.

One advantage of the embodiments of the present invention is the systems and methods allow some of the independent electrical connectors within the light engine to be replaced with other electrical connectors (e.g., support connectors). Replacing IDCs with support connectors does not alter the quality of the light produced by the LED light assembly, however, since support connectors are less costly than their IDC counterparts, the cost associated with manufacturing and/or maintaining the light engine can reduced.

In the embodiments, a light engine includes an IDC in connection with a plurality of support connectors. The IDC and the plurality of support connectors are in contact with a power conductor to form the light engine. The existence of the IDC within the light engine allows the light engine to function as a parallel circuit. Additionally, the use of support connectors reduces the cost associated with manufacturing and maintaining the light engine.

In some embodiments, multiple IDCs are within the light engine. The existence of multiple independent IDCs allows LEDs attached to remaining electrical connectors to continue to function even if one IDC is compromised. In specific embodiments, for example, the IDCs can be located at the beginning and end of the light engine.

Another advantage is that the embodiments provide flexible LED light assemblies. Assembly flexibility can enable consumers to optionally alter the shape of an assembly without replacing the assembly.

In the embodiments, the guide and light engine housing are created using flexible materials. Additionally, the electrical connectors are joined using a flexible printed circuit (FPC). The FPC assists in allowing the light engine to be contoured into different shapes.

Yet another advantage is the systems and methods reduce stress placed on the electrical connectors when the shape of the LED light assembly is altered. Reducing stress on the electrical connectors decreases the likelihood of electrical component failure due to improper connection with the power conductor when there is movement of the electrical connector during shaping of the light engine.

In the embodiments, a portion of the FPC is gathered between each electrical connector. The gathered FPC allows for the flexing of the light engine while minimizing the stress on the power conductor as well as the electrical components.

In yet other embodiments, the gathered FPC can be contoured into shapes, such as a semi-circle loop, a helix or the like.

Also in the embodiments are methods for reducing the stress within the light engine. The methods including receiving an FPC into an ingress of a first electrical connector and positioning the FPC on a top of the first electrical connector, passing the FPC out of an egress of the first electrical connector, contouring the FPC passed out of the egress into a FPC gathering of material; supplying the FPC gathering into an ingress of a second electrical connector and positioning the FPC on the top of the second electrical connector, and attaching at least one LED to the top of the first electrical connector and the second electrical connector.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

IV. BRIEF DESCRIPTION OF THE DRAWINGS

The accompanying drawings, which are incorporated herein and form part of the specification, illustrate the present invention and, together with the description, further serve to explain the principles of the invention and to enable a person skilled in the relevant art(s) to make and use the invention.

V. DETAILED DESCRIPTION OF THE PREFERRED EMBODIMENTS

While the present invention is described herein with illustrative embodiments for particular applications, it should be understood that the invention is not limited thereto. Those skilled in the art with access to the teachings provided herein will recognize additional modifications, applications, and embodiments within the scope thereof and additional fields in which the invention would be of significant utility.

Unless defined otherwise, technical and scientific terms used herein have the same meaning as is commonly understood by one of ordinary skill in the art to which this disclosure belongs. The terms "first," "second," and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean either, any, several, or all of the listed items.

The use of "including," "comprising," or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect. The terms "circuit," "circuitry," and "controller" may include either a single component or a plurality of components, which are either active and/or passive components and may be optionally connected or otherwise coupled together to provide the described function.

Figure 1:
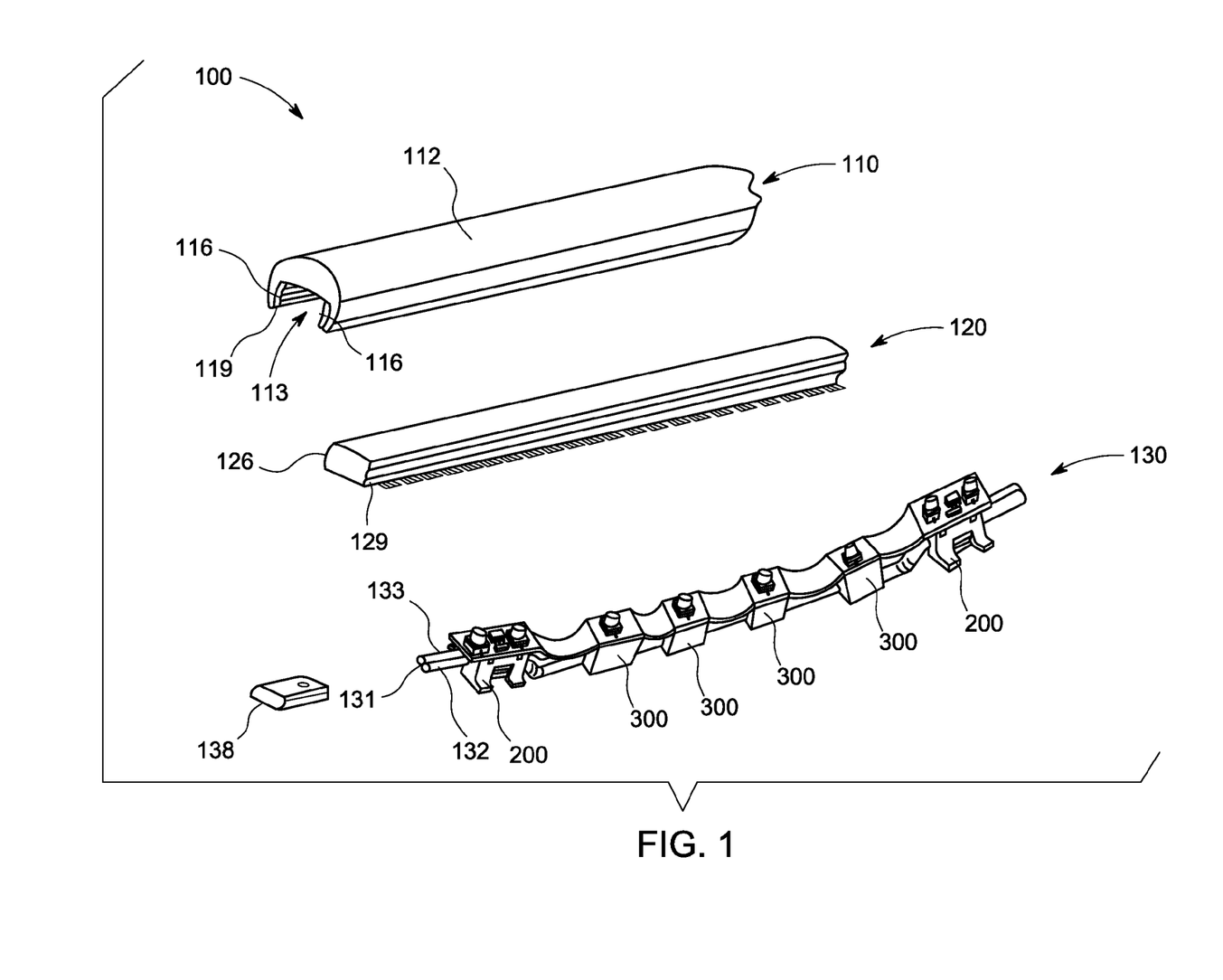
FIG. 1 is an exploded perspective view depicting an illumination device useful for simulating neon lighting in accordance with an embodiment of the present invention.
Figure 2A:
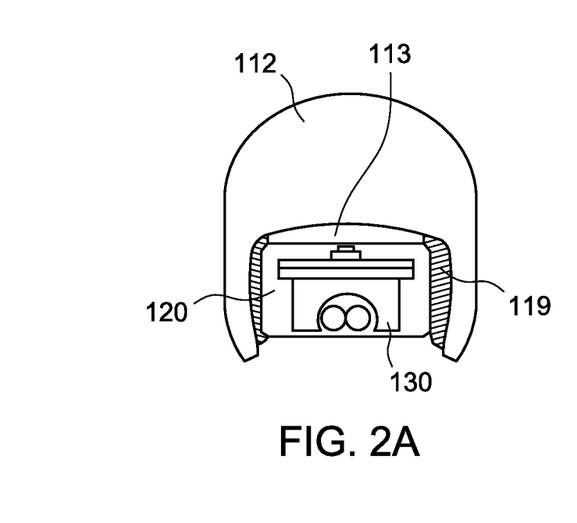
FIGS. 2A-2D are illustrations of various side views of the illumination device of FIG. 1.
Figure 2B:
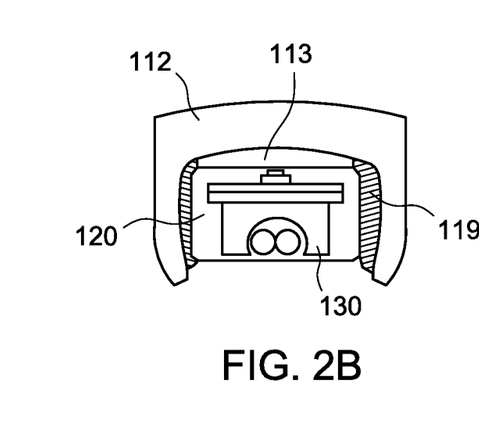
Figure 2C:
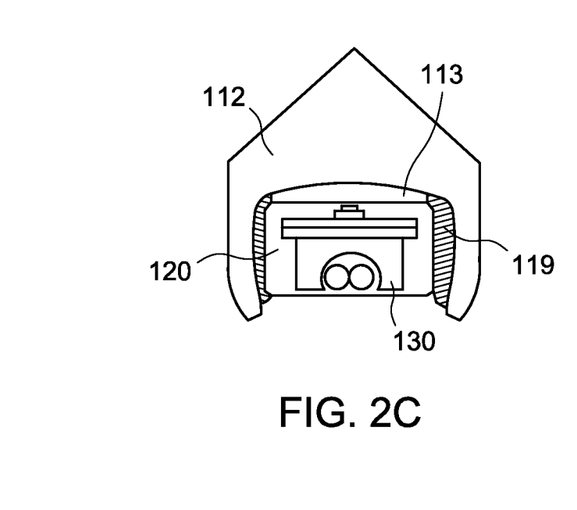
Figure 2D:
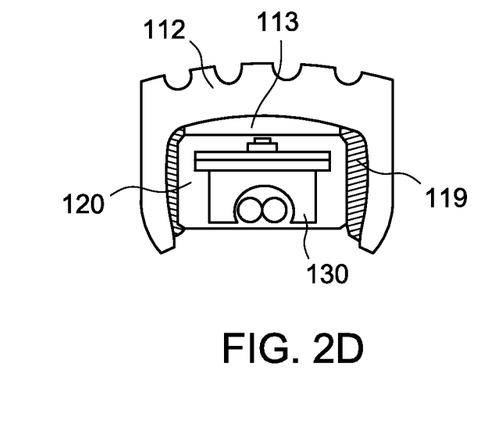

FIG. 1 is an exploded perspective view of an illumination device 100 useful for simulating neon lighting. The illumination device 100 is a flexible device that can be contoured into a desired configuration. The illumination device 100 includes a guide 110, a housing 120, and a light engine 130.

The guide 110 is an extruded piece of material used to display the illumination generated by the light engine 130 (described below). The guide 110 includes an outer surface 112, which emits light generated by the light engine 130, and a guide channel 113, which is a hollow cavity for receiving the housing 120 (described below). Sidewalls 116 are located within an interior of the guide 110, on either side of the guide channel 113. The sidewalls 116 include guide engagement members 119 along the inside of the guide channel 113. The guide engagement members 119 are tracks integrated into the sidewalls 116 that provide electrical contact between the guide 110 and the housing 120. The guide engagement members 119 can run the length of the guide 110, the length of the housing 120, or another predetermined length to ensure sufficient electrical contact between the guide 110 and the housing 120.

The guide 110 can be manufactured using any known method of molding materials into desired shapes. The material used in creating the guide 110 can be structured such that the guide 110 is flexible and alterable after completion of the manufacturing. For example, the guide 110 can be created by thermoforming using a theromoformable material, such as but not limited to high-density polyethylene (HDPE), high impact polystyrene (HIPS), or polycarbonate (PC). The guide 110 can also be created using injection molding techniques that include materials such as but not limited to thermoplastic or thermosetting polymers.

The guide 110 can also be created in a way that permits sections of expansion/contraction within the guide 110. Using a flexible material that expands/contracts enables the guide 110 to be alterable in shape by the consumer.

The housing 120 is an extruded material used to protect the light engine 130. The housing 120 can be designed as a sleeve or other opening (e.g., a housing channel) to receive the light engine 130. The housing 120 may enclose the light engine 130 such that the components of the light engine 130 are securely positioned. The housing 120 may also be designed to include housing engagement members 129 on a sidewall 126. The housing engagement members 129 can be integrated with the guide engagement members 119 of the guide 110.

Similar to the guide 110, the material used to manufacture the housing 120 may allow the housing 120 to be altered after manufacturing has been completed. Such materials may be thermoformable or other type flexible materials known in the art.

The light engine 130 is an assembly of electrical connectors, e.g., IDCs 200 and support connectors 300. Each IDC 200 and support connector 300 is powered through a conductor 131, such as a cab.

The conductor 131 contains a positive wire 132 and a negative wire 133. The conductor 131 may also contain additional wires, such as a ground wire or series conductor wire. The wires 132, 133 allow the IDCs 200 and the support connectors 300 to be electrically connected along the conductor 131. In the example of FIG. 1, the conductor 131 is protected by an insulating material to prevent energization of unintended materials. The conductor 131 is also protected on each end by a cap 138.

The IDC 200 is an electrical connector designed for connection to the conductor 131. Each IDC 200 contains at least one LED, which receives power from the conductor 131. The support connector 300 is an electrical connector also designed for connection to the conductor 131. Similar to each IDC 200, each support connector 300 contains at least one LED that receives power form the conductor 131.

The IDCs 200 and the support connectors 300 may be spaced relatively close to one another to create an overlap pattern, e.g., to simulate a beam, or further apart to create a separate and distinct light pattern. Additionally, the IDCs 200 and the support connectors 300 can be connected to one another by any number of connection materials, e.g., an FPC or the like. The IDCs 200 and the support connectors 300 are discussed in additional detail below.

As understood by one of skill in the art, the illumination device 100 may be of varying lengths and include more or fewer of the IDCs 200 and the support connectors 300 than depicted in the exemplary embodiment of FIG. 1.

FIGS. 2A-2D are illustrations of various side views of the illumination device 100. FIGS. 2A-2D represent cross sections of the guide 110 normal to a longitudinal axis. In the embodiments, the side view includes the outer surface 112, varying in shape for each embodiment; the guide channel 113, including the guide engagement members 119; the housing 120, including the housing engagement members 129 (not shown); and the light engine 130, contained within the housing 120. The shape and size of the outer surface 112 can differ as long as the guide 110 includes the guide channel 113 to receive the housing 120. Additionally, the guide engagement members 119 are desirably positioned to contact the housing engagement members 129.

The shape of the outer surface 112 can be optimized in accordance with different lighting applications. The embodiment of FIG. 2A may be useful for lighting applications that require the produced light to be projected in a wide angle of visibility. For example, the projected light may produce an angle of visibility of up to 350 degrees. An embodiment similar to FIG. 2B might be useful when a low profile outer surface 112 is needed in a space constrained location. The embodiment in FIG. 2C can be useful when the illumination is directed to a focal point. The embodiment in FIG. 2D can be useful for creating designs, within the illumination.

Figure 3:
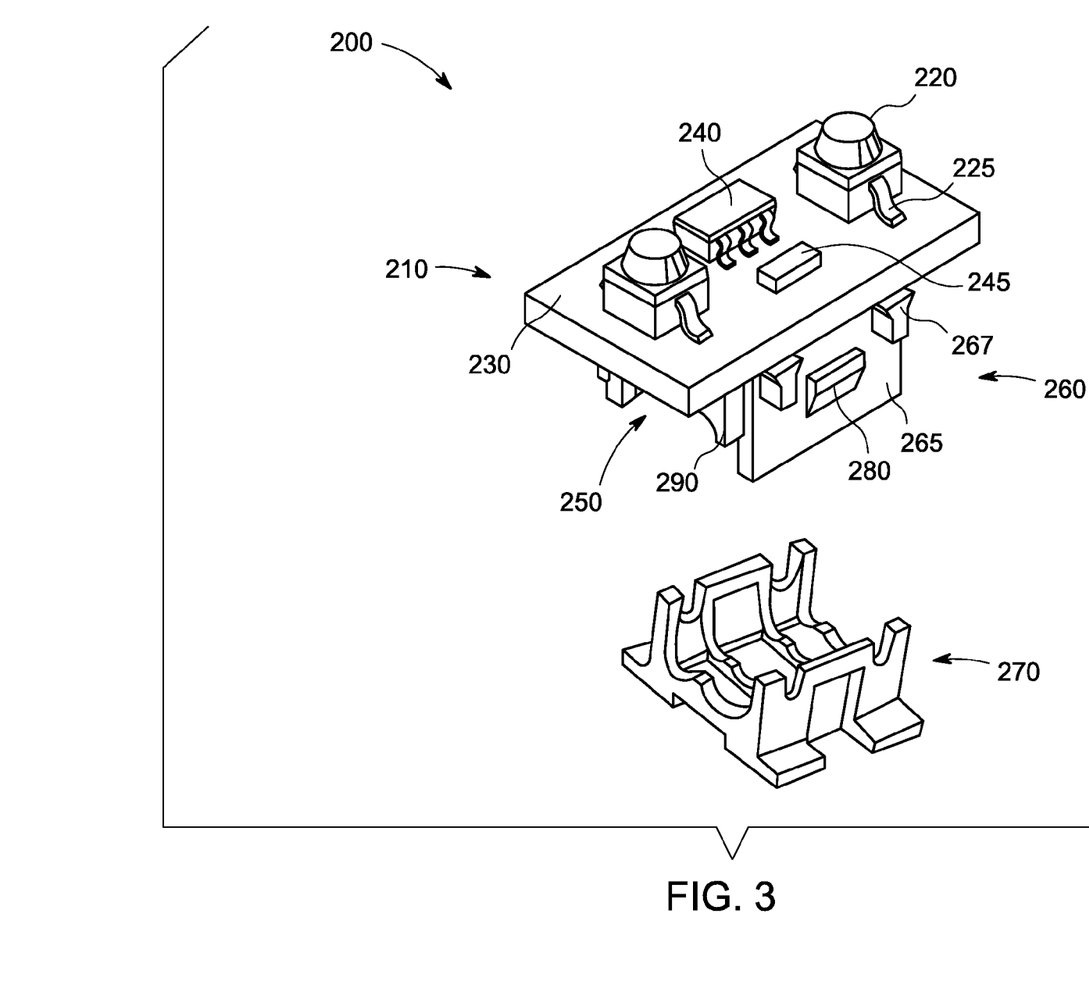
FIG. 3 is an exploded perspective view depicting an IDC within the light engine of FIG. 1.

FIG. 3 is an exploded perspective view of the IDC 200 within the light engine 130 of FIG. 1. The IDC 200 includes a top 210, a casing 260, and a base 270. Between the casing 260 and the base 270 exists a channel 250 where the conductor 131 (not shown) is attached to the IDC 200.

The top 210 includes at least one LED 220 (two LEDs shown in FIG. 3) and associated LED leads 225 for each LED 220. The FPC 230 includes an ingress FPC component (not shown) received by the IDC 200 and an egress FPC component (not shown) produced from the IDC 200.

The FPC 230 is a flex circuit manufactured with components similar to a PCB, but also allows the top 210 to conform to a desired shape or flex during use. By way of example, the FPC 230 can be formed of flexible plastic substrates such as polyimide (PI), polyether ether ketone (PEEK), or polyester.

The FPC 230 can be produced using photolithographic technology or other microfabrication process, which enables a desired circuit pattern to be imprinted, etched, or embedded on the circuit. For example, the FPC 230 can include many configurations, such as a single-sided flex circuit having a single conductor layer or a double-sided flex circuit having two conductor layers. The FPC 230 can also be a multilayer flex circuit having more than three conductor layers, or a double access flex circuit having a single conductor layer with access to selected features of the conductor pattern available from both sides.

The LED 220 can be any LED of suitable size and shape for mounting to the ICD top 210. The LED 220 can be surface mounted to the IDC top 210, mounted by a through-hole, or mounted using other connection techniques known in the art. The leads 225 for each LED 220 are electrically connected to a printed circuitry contained on a conductor layer of the FPC 230.

The LED 220 may also included additional components to enhance quality or other characteristic of the emitted light. For example, the LED 220 may include an optic lens (not shown) to enhance the directional output of the light emitted by the LED 220.

The overall size and shape of each IDC top 210 is desirably substantially similar to allow for seamless integration within the light engine 130. However, circuitry located on each IDC top 210 may differ in components.

For example, one IDC top 210 may include an FPC 230 containing a driver 240 and a resistor 245, whereas another IDC top 210 may include an FPC 230 with no such components. Both the driver 240 and the resistor 245 are in electrical communication with the LEDs 220 through the printed circuitry on the FPC 230. Additional components may also be added to the IDC top 210 and in electrical communication with the LEDs 220.

The IDC top 210 is supported by the casing 260, allowing the top 210 to reside parallel to the conductor 131. The casing 260 includes sidewalls 265, guides 267, tabs 280, and a conductor platform 290.

The casing 260 includes a sidewall 265 on either side of the IDC channel 250. The sidewalls 265 support the position of the top 210. The guides 267 are located at each corner of the sidewalls 265 and support the top 210 into a fixed location once the conductor 131 is engaged. The casing 260 is attached to the base 270 by mechanical means, e.g., the tab 280, located each sidewall 265.

The casing 260 connects to the IDC top 210 either by a bonding means, such as with an adhesive or thermal bonding. The top 210 may include the casing 260 already attached using a process such as injection molding. Alternatively, the top 210 and the casing 260 can be fastened mechanically, chemically, or another connection means known in the art.

The conductor platform 290 includes recesses for each wire within the conductor 131. The base 270 secures the casing 260 to the conductor 131. The base 270 includes recesses for each wire within the conductor 131, similar to the conductor platform 290. As such, when the IDC 200 is fully engaged with the conductor 131, the conductor will be securely positioned within the channel 250.

Figure 4:
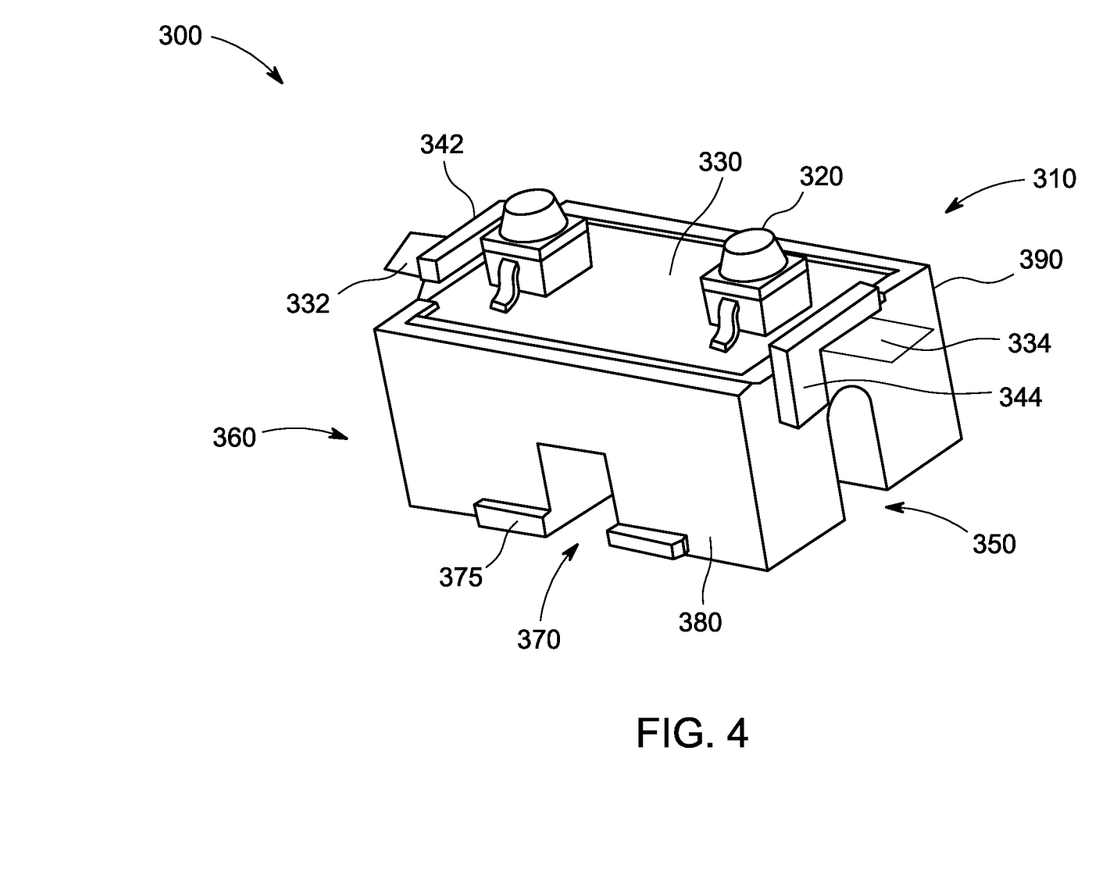
FIG. 4 is a perspective view of a support connector within the light engine of FIG. 1.
Figure 5:
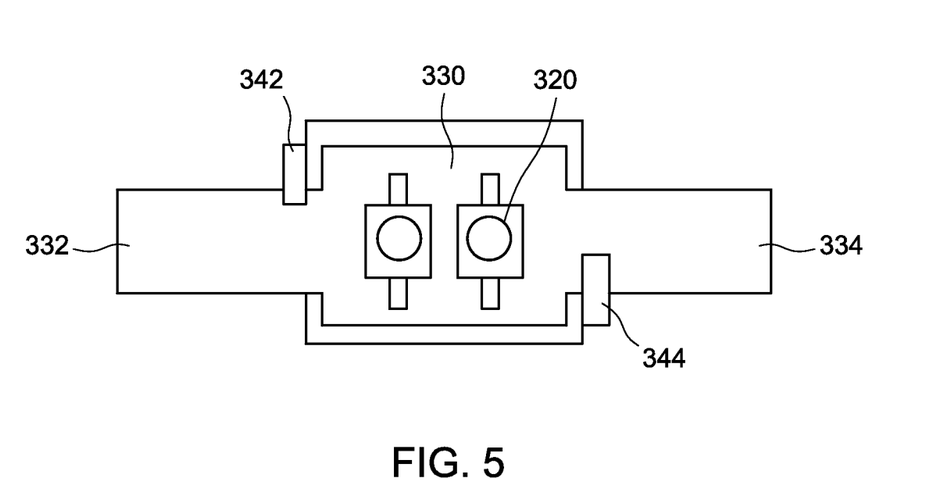
FIG. 5 is a top view depicting the support connector of FIG. 3

FIGS. 4-5 depict the support connector 300 within the light engine 130 of FIG. 1. FIG. 4 is a perspective view of the support connector 300 while FIG. 5 is a top view of the support connector 300. The support connector 300 includes a top 310 and a base 360.

The support connector top 310, similar to the IDC top 210, is depicted in FIG. 4 as an FPC 330. The IDC top 210 includes at least one LED 320 (two LEDs shown) and LED leads 325. The LEDs 320 and the LED leads 325 are substantially similar in function to the LEDs 220 and the LED leads 225 described in FIG. 3. However, aesthetic characteristics, such as the shape and size of the LEDs 320, may differ from the LEDs 220.

The FPC 330 includes an ingress FPC 332 receivable into the support connector 300, and an egress FPC 334, receivable by the subsequent electrical connector, e.g., an IDC 200 or a support connector 300.

The support connector base 360 includes an ingress guide 342, an egress guide 344, and a channel 350.

The ingress guide 342 and egress guide 342 are designed to secure the position of the FPC 330. More specifically, the ingress guide 342 secures the position of the ingress FPC 332, and the egress guide 344 secures the position of the egress FPC 334. The guides 342 and 344 desirably face opposite directions on the support connector 300 (seen clearly in FIG. 5). In this manner, the guides 342, 344 ensure the ingress FPC 332 and egress FPC 334 remain in contact with the base 360 during stress and strain due to adjustment of the FPC 330.

The base 360 includes a channel 350, permitting the conductor 131 (not shown) to attach to the support connector 300. The channel 350 also includes a conductor platform (not shown) for engaging the conductor 131.

In some embodiments, the base 360 includes a cavity 370 that includes a portion of the conductor platform for engaging the conductor 131. The cavity 370 contains an accompanying cavity support 375 providing stability for the base 360 as it engages the conductor 131. The cavity supports 375 are located on each side of the cavity opening through the base 260, e.g., on a support connector face 380 an on a support connector face 390. The cavity support connectors are also located on each side of the cavity 370 on the same on each face 380, 390.

Figure 6:
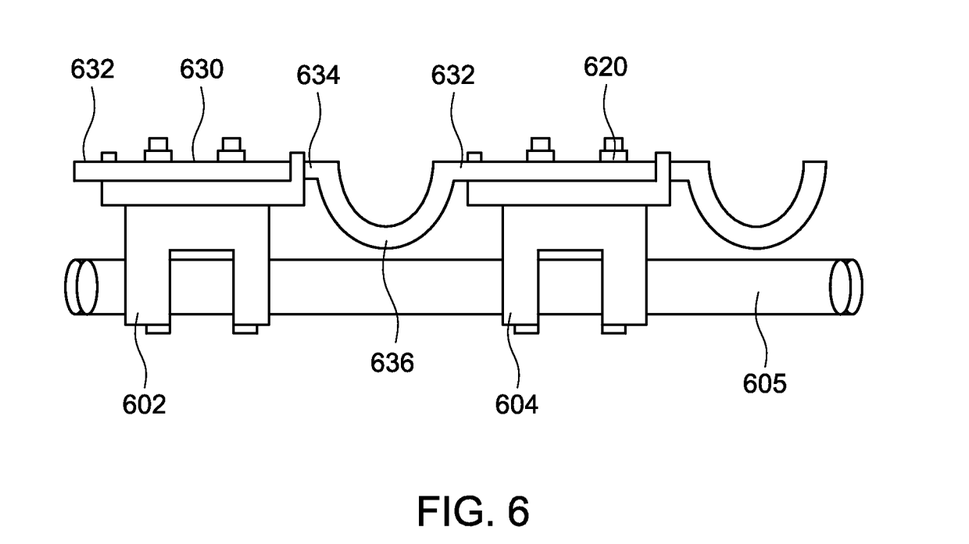
FIG. 6 is a side view depicting the joining of multiple support connectors within a light engine, similar to the light engine of FIG. 1

FIG. 6 depicts the joining of the multiple support connectors within a light engine, similar to the light engine of FIG. 1. In FIG. 6, a support connector 602 and a support connector 604 (similar to the support connector 300) are in electrical connection with a power conductor 605 (similar to conductor 131). Each support connector contains LEDs 620 and an FPC 630.

Within the support connector 602, the FPC 630 includes an ingress FPC 632 and an egress FPC 634. The egress FPC 634 forms a FPC semi-circle loop 636 (e.g., a loop). The loop 636 is consists of material between the support connectors 602 and 604. The loop 636 begins at the egress FPC 634 of the support connector 602 and connects to the ingress FPC 632 of the support connector 604.

The function of the loop 636 is to reduce/limit transfer of forces from the FPC 630 to the support connectors 602, 604. Additionally the loop 636 ensures proper connectivity between the power conductor 605 and support connectors 602, 604 during contouring of the light engine. The loop 636 is desirably thin in width to allow for a maximum amount of FPC material to be included between the support connectors 602, 604. Furthermore, the loop 636 should not increase trace resistance within the light engine to a level higher than an allowable voltage drop.

Figure 7:
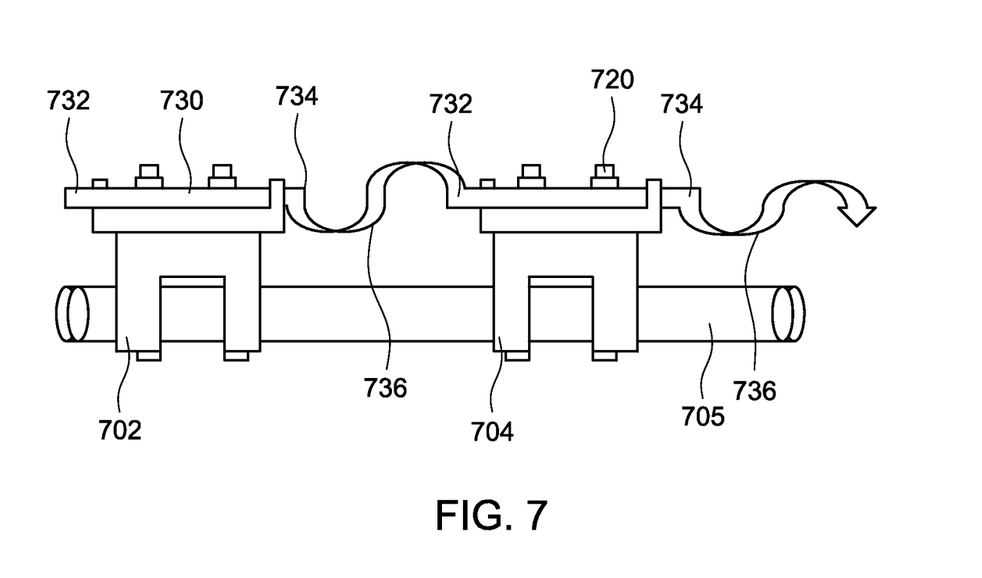
FIG. 7 is a side view depicting an alternate embodiment of a joining of multiple support connectors.
Figure 8:
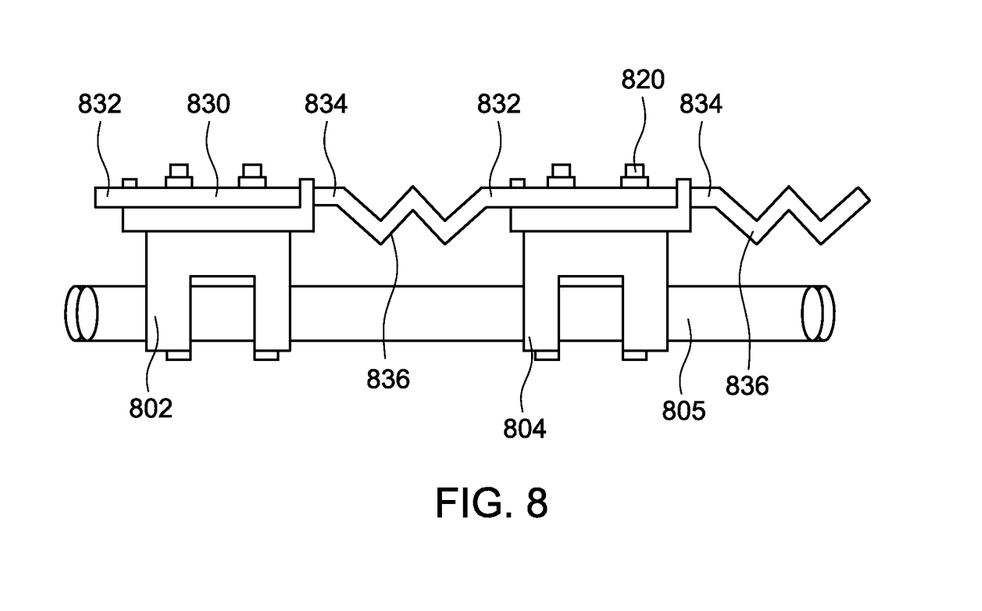
FIG. 8 is a side view depicting a second alternate embodiment of a joining of multiple support connectors.

FIGS. 7-8 depict alternate embodiments of the joining of multiple support connectors. In FIG. 7, support connectors 702 and 704 receive power from a power conductor 705. FIG. 8, support connectors 802 and 804 receive power from a power conductor 805. In FIG. 7, the support connectors include LEDs 720 and an FPC 730. In FIG. 8, the support connectors include LEDs 820 and an FPC 830.

Within FIG. 7, each of the egress FPCs 734 forms a helix 736 coiling around an imaginary axis parallel to longitudinal axis of the light engine when the light engine is fully extended, without any contours. Each helix 736 begins at the egress FPC 734 of a support connector and ultimately connects to the ingress FPC 734 of a subsequent support connector. For example, the helix 736 begins at the egress FPC 734 on support connector 702 and connects to the ingress FPC 734 of the support connector 704.

By way of example, the helix 736 can be a single helix, as depicted in FIG. 7, or it can be multiple helices that intertwine to connect the egress FPC 734 to the ingress FPC 732. Similar to the loop 640 in FIG. 6, the helix 736 desirably limits desirably limits the transfer stress to the support connectors 702, 704. At the same time, the helix 736 ensures a proper connection is maintained between the power conductor 705 and support connectors 702 and 704.

In FIG. 8, each of the egress FPCs 832 and 834 forms a ridge 836 for reducing stress transferred to the support connectors from the power conductor 805.

The ridge 836 can be similar to the bellows of an accordion, which compress and expand as the support connectors 802, 804 adjust. Similar to the helix 736, each ridge 836 begins at the egress FPC 834 of one support connector and ultimately connects to the ingress FPC 834 of another support connector.

It is understood that the illustrious embodiments described in FIG. 6-8 may be used in varying configurations of electrical connectors. The gathering of FPC material (e.g., loop 636, helix 736, ridge 836) may be used irrespective of the electrical connection. More specifically, the gathering of FPC material may be used to join two support connects (as seen in FIGS. 6-8), to join two IDCs, or to join an IDC and a support connector.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What we claim is:

1. A flexible light engine comprising:
   a flexible printed circuit (FPC) running a length;
   a plurality of light emitting diodes (LEDs), at least one LED being attached to the FPC; and
   a plurality of electrical connectors, attached in a sequence, each electrical connector maintaining a structure of the FPC and the at least one attached LED and configured to connect with a power conductor,
   wherein the FPC creates a gathering of material between each of the plurality of electrical connectors, the gathering of material configured to form a predetermined shape for limiting force transferred between the FPC and each electrical connector.

2. The device of claim 1, wherein at least one LED is attached to each of the plurality of electrical connectors within the sequence.

3. The device of claim 1, wherein at least one electrical connector of the plurality of electrical connectors functions independent from the remaining electrical connectors within the plurality of electrical connectors.

4. The device of claim 3, wherein a first electrical connector in the sequence and a last electrical connector in the sequence of the plurality of electrical connectors each functions independent from the remaining electrical connectors within the sequence.

5. The device of claim 1, wherein the gathering of material between each of the plurality of electrical connectors reduces a strain of force felt on each of the plurality of electrical connectors when there is a change in the position of the power conductor.

6. The device of claim 1, wherein the gathering of material between each of the plurality of electrical connectors forms a semi-circle loop.

7. The device of claim 1, wherein the gathering of material between each of the plurality of electrical connectors forms a helix, formed about an axis parallel to a longitudinal axis of the light engine.

8. An illumination system for simulating neon lighting, comprising:
   an elongated guide, forming a length, the elongated guide comprising an outer surface and a channel, located opposite the outer surface, the channel comprising an engagement member;
   a housing, forming a length, the housing comprising an engagement member and area for receiving a light engine assembly, the engagement member of the housing positioned to contact the engagement member of the elongated guide; and
   the light engine, forming a length, the light engine comprising:
      a flexible printed circuit (FPC) running the length of the housing;
      a plurality of light emitting diodes (LEDs) attached to the FPC, each of the plurality of LEDs positioned to emit light in the direction of the outer surface of the elongated guide; and a plurality of electrical connectors, attached in a sequence, each electrical connector maintaining a structure of the FPC and the plurality of LEDs and configured to connect with a power conductor being the length of the light engine, wherein the FPC creates a gathering of material between each of the plurality of electrical connectors, the gathering of material configured to form a predetermined shape for limiting force transferred between the FPC and each electrical connector.

9. The device of claim 8, wherein the elongated guide and the housing are made from materials that allows an initial shape of the elongated guide and the housing to be altered.

10. The device of claim 8, wherein at least one electrical connector of the plurality of electrical connectors functions independent from the remaining electrical connectors within the plurality of electrical connectors.

11. The device of claim 10, wherein a first electrical connector in the sequence and a last electrical connector in the sequence of the plurality of electrical connectors each functions independent from the remaining electrical connectors within the sequence.

12. The device of claim 8, wherein the gathering of material between each of the plurality of electrical connectors reduces a strain of force felt on each of the plurality of electrical connectors when there is a change in the position of the power conductor.

13. The device of claim 8, wherein the gathering of material between each of the plurality of electrical connectors forms a semi-circle loop.

14. The device of claim 8, wherein the gathering of material between each of the plurality of electrical connectors forms a helix, formed about an axis parallel to a longitudinal axis of the light engine.

15. A method for reducing forces between electrical connectors within an illumination system for simulating neon lighting, comprising:

receiving a flexible printed circuit (FPC) into an ingress of a first electrical connector, the first electrical connector comprising a top and a base;

positioning the FPC on the top of the first electrical connector;

passing the FPC out of an egress of the first electrical connector;

contouring the FPC passed out of the egress into a FPC gathering of material configured to form a predetermined shape for limiting force transferred between the FPC and the first electrical connector;

supplying the FPC gathering into an ingress of a second electrical connector, the second electrical connector comprising a top and a base;

positioning the FPC on the top of the second electrical connector; and attaching at least one LED to a portion of the FPC located on the top of the first electrical connector and attaching at least one LED to a portion of the FPC located on the top of the second electrical connector.

16. The method of claim 15, further comprising positioning the FPC received into the ingress of the first electrical connector by an ingress guide arm.

17. The method of claim 15, further comprising positioning the FPC passed out of the egress of the first electrical connector by an egress guide arm.

18. The method of claim 15, further comprising contouring the FPC gathering of material into a semi-circle loop that connects the egress of the first electrical connector to the ingress of the second electrical connector.

19. The method of claim 15, further comprising contouring the FPC gathering of material into a helix that connects egress of the first electrical connector to the ingress of the second electrical connector, the helix formed about an axis parallel to a longitudinal axis of the illumination system.

20. The method of claim 15, further comprising transporting the FPC to a plurality of subsequent electrical connectors, each electrical connector comprising a top and a base, wherein the FPC is supplied through an ingress of each electrical connection of the plurality of subsequent electrical connections and positioned on the top of each electrical connection of the plurality of subsequent electrical connections.

* * * * *